US008835316B2

(12) United States Patent
Yin et al.

(10) Patent No.: US 8,835,316 B2
(45) Date of Patent: Sep. 16, 2014

(54) TRANSISTOR WITH PRIMARY AND SEMICONDUCTOR SPACER, METHOD FOR MANUFACTURING TRANSISTOR, AND SEMICONDUCTOR CHIP COMPRISING THE TRANSISTOR

(75) Inventors: Haizhou Yin, Poughkeepsie, NY (US); Jun Luo, Beijing (CN); Huilong Zhu, Poughkeepsie, NY (US); Zhijiong Luo, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 346 days.

(21) Appl. No.: 13/378,997

(22) PCT Filed: Aug. 9, 2011

(86) PCT No.: PCT/CN2011/001309
§ 371 (c)(1),
(2), (4) Date: Dec. 16, 2011

(87) PCT Pub. No.: WO2013/003986
PCT Pub. Date: Jan. 10, 2013

(65) Prior Publication Data
US 2013/0009217 A1 Jan. 10, 2013

(30) Foreign Application Priority Data
Jul. 6, 2011 (CN) .......................... 2011 1 0188060

(51) Int. Cl.
*H01L 29/772* (2006.01)
*H01L 21/3213* (2006.01)
*H01L 21/768* (2006.01)
*H01L 29/78* (2006.01)
*H01L 29/66* (2006.01)
*H01L 29/417* (2006.01)
*H01L 21/285* (2006.01)

(52) U.S. Cl.
CPC ...... *H01L 29/7833* (2013.01); *H01L 21/32139* (2013.01); *H01L 21/76897* (2013.01); *H01L 29/665* (2013.01); *H01L 29/41775* (2013.01); *H01L 21/28518* (2013.01); *H01L 29/6659* (2013.01)
USPC ............................ 438/682; 438/655; 438/755

(58) Field of Classification Search
USPC .......................................... 438/655, 682, 755
See application file for complete search history.

(56) References Cited

U.S. PATENT DOCUMENTS

| 6,627,502 B1 | 9/2003 | Cho |
| 2004/0108598 A1* | 6/2004 | Cabral et al. ................. 257/754 |
| 2009/0152626 A1 | 6/2009 | Venugopal et al. |

FOREIGN PATENT DOCUMENTS

| CN | 1653621 A | 8/2005 |
| CN | 1883042 A | 12/2006 |

OTHER PUBLICATIONS

Chinese PCT Search Report and Written Opinion, PCT/CN2011/001309 issued (Apr. 5, 2012), 11 pages.

*Primary Examiner* — Michael Jung
*Assistant Examiner* — John P Dulka
(74) *Attorney, Agent, or Firm* — Martine Penilla Group, LLP

(57) ABSTRACT

The disclosure provides a transistor, a method for manufacturing the transistor, and a semiconductor chip comprising the transistor. The transistor comprises: an active area, a gate stack, a primary spacer, and source/drain regions, wherein the active area is on a semiconductor substrate; the gate stack, the primary spacer, and the source/drain regions are on the active area; the primary spacer surrounds the gate stack; the source/drain regions are embedded in the active area and self-aligned with opposite sides of the primary spacer. Wherein the transistor further comprises: a silicide spacer, wherein the silicide spacer is located at opposite sides of the primary spacer, and a dielectric material is filled between the two ends of the silicide spacer in the width direction of the gate stack, so as to isolate the source/drain regions from each other.

9 Claims, 9 Drawing Sheets

Ni pipes 109

TRANSISTOR WITH PRIMARY AND SEMICONDUCTOR SPACER, METHOD FOR MANUFACTURING TRANSISTOR, AND SEMICONDUCTOR CHIP COMPRISING THE TRANSISTOR

CLAIM OF PRIORITY

This application is a Section 371 National Stage Application of International Application No. PCT/CN2011/001309, filed on Aug. 9, 2011, which claims priority to CN201110188060.7, filed on Jul. 6, 2011 entitled "TRANSISTOR, METHOD FOR MANUFACTURING TRANSISTOR, AND SEMICONDUCTOR CHIP COMPRISING THE TRANSISTOR", the entire contents of which are incorporated herein by reference in their entirety.

FIELD OF THE INVENTION

The present invention generally relates to semiconductor technology, and more particularly to a novel transistor, a method for manufacturing the transistor, and a semiconductor chip comprising the transistor.

BACKGROUND OF THE INVENTION

As shown in FIG. 1, for example, during the manufacturing process of a MOS transistor, after forming a gate stack and source/drain regions 102, it is required to form on the source/drain regions 102 a metal silicide contact, in order to provide a low resistance connection between the source/drain regions of the transistor and a W metal contact hole in the BEOL (Back-end-of-line). The specific steps for forming the metal silicide contact comprise, after forming the source/drain regions, depositing a layer of metal, e.g., a layer of Ni or Ni alloy, on the whole surface of the semiconductor structure (including the gate stack, the spacer 111, the source/drain regions 102 and the STI (Shallow Trench Isolation) 110), and then annealing the resulting structure so that a layer of silicide of Ni 103 (e.g. NiSi) with a certain thickness is formed within the surface of the source/drain regions 102 of the transistor. The layer of silicide of Ni 103 can reduce the source/drain contact resistance. However, the following problems arise during the process. As the transistor scales down, the distance between the gate and the W metal contact hole acting as the source/drain contact hole is becoming smaller, and the distance between the channel region between the source/drain extension regions 108 and the layer of silicide of Ni 103 acting as a contact region scales down. As a result, the probability for Ni in the layer of silicide of Ni 103 and even the excessive Ni in the layer of Ni or Ni alloy 107 deposited on the spacer 111 to enter the channel region through the source/drain extension regions 108 is increased, which forms a leakage path and reduces the yield.

Shown in FIG. 1 are Ni pipes 109 formed in the source/drain extension regions 108 directly under the spacer 111, for example, as indicated by the bold oblique line which goes through the source/drain extension regions 108 from the layer of silicide of Ni 103 to the channel region. The Ni pipes 109 can be considered as the leakage path along which Ni pass.

To this end, there is an urgent need in the art for improvement of the transistor technology.

OBJECT AND SUMMARY OF THE INVENTION

In view of this, the present invention provides a transistor, a method for manufacturing the transistor, and a semiconductor chip comprising the transistor, which can solve or at least alleviate at least some defects in the prior art.

According to the first aspect of the present invention, it is provided a method for manufacturing a transistor, which may comprise:

defining an active area on a semiconductor substrate, and forming on the active area a gate stack, a primary spacer, and source/drain regions, wherein the primary spacer surrounds the gate stack, and the source/drain regions are embedded in the active area and self-aligned with opposite sides of the primary spacer;

forming a semiconductor spacer surrounding the primary spacer, and cutting off the ends of the semiconductor spacer in the width direction of the gate stack so as to isolate the source/drain regions from each other; and covering the surfaces of the source/drain regions and the semiconductor spacer with a layer of metal or alloy, and annealing the resulting structure, so that a metal silicide is formed on the surfaces of the source/drain regions, and so that the semiconductor spacer is transformed into a silicide spacer simultaneously.

In an embodiment of the present invention, the step of forming the semiconductor spacer surrounding the primary spacer, and cutting off the ends of the semiconductor spacer in the width direction of the gate stack so as to isolate the source/drain regions from each other further may comprise:

forming an etch-stop layer on the surfaces of the source/drain regions and the primary spacer;

forming a semiconductor layer on a surface of the etch-stop layer;

etching the semiconductor layer to form the semiconductor spacer surrounding the primary spacer;

removing the ends of the semiconductor spacer in the width direction of the gate by etching to avoid electrical conduction between the source/drain regions; and removing an exposed portion of the etch-stop layer.

In another embodiment of the present invention, in the step of etching the semiconductor layer to form the semiconductor spacer surrounding the primary spacer, preferably, the height of the semiconductor spacer are lower than that of the primary spacer.

In another embodiment of the present invention, if the active area is isolated by an isolation structure, and if in the width direction of the gate stack, the ends of the gate stack lie above the isolation structure, the step of removing the ends of the semiconductor spacer in the width direction of the gate by etching may further comprise: removing a portion of the semiconductor spacer on the isolation structure by etching.

In yet another embodiment of the present invention, after the step of covering the surfaces of the source/drain regions and the semiconductor spacer with the layer of metal or alloy and annealing the resulting structure, the method may further comprise:

removing unreacted metal or alloy.

In an embodiment of the present invention, the step of covering the surfaces of the source/drain regions and the semiconductor spacer with the layer of metal or alloy and annealing the resulting structure may comprise:

depositing the layer of metal or alloy on surfaces of all of the semiconductor substrate, the source/drain regions, the primary spacer and the semiconductor spacer, and annealing the resulting structure.

In another embodiment of the present invention, the layer of metal or alloy may comprise Ni, Co, Ti or NiPt.

In another embodiment of the present invention, the etch-stop layer comprises SiGe or amorphous Si.

In yet another embodiment of the present invention, the semiconductor spacer comprises amorphous Si or SiGe.

In another embodiment of the present invention, the material of the etch-stop layer differs from that of the semiconductor spacer.

According to the second aspect of the present invention, it is provided a transistor, comprising:

an active area, a gate stack, a primary spacer, and source/drain regions, wherein the active area is on a semiconductor substrate; the gate stack, the primary spacer, and the source/drain regions are on the active area; the primary spacer surrounds the gate stack; the source/drain regions are embedded in the active area and self-aligned with opposite sides of the primary spacer, wherein, the transistor further comprises:

a silicide spacer, wherein the silicide spacer is located at opposite sides of the primary spacer, and a dielectric material is filled between the two ends of the silicide spacer in the width direction of the gate stack, so as to isolate the source/drain regions from each other.

In an embodiment of the present invention, a metal silicide layer is formed on surfaces of the source/drain regions.

In another embodiment of the present invention, an etch-stop layer is sandwitched between the silicide spacer and the primary spacer, and the etch-stop layer may comprise SiGe or amorphous Si.

In another embodiment of the present invention, the silicide spacer is formed by a reaction between amorphous Si or SiGe and metal or alloy during annealing.

In yet another embodiment of the present invention, the height of the silicide spacer is lower than that of the primary spacer.

In an embodiment of the present invention, the silicide spacer comprise Ni element.

In another embodiment of the present invention, if the active area is isolated by an isolation structure, and if the ends of the gate stack lie above the isolation structure, a dielectric material is provided on the isolation structure between the ends of the silicide spacer.

According to the third aspect of the present invention, it is provided a semiconductor chip comprising the transistor described above.

By means of the novel design of the present invention, if the transistor is scaling down, silicide spacer are further formed at the periphery of the gate primary spacer. On one hand, large quantity of Ni or other metal is reacted to form the silicide spacer. On the other hand, the physical distance for the metal to enter the channel region via the silicide spacer and the source/drain extension regions are increased, thus reducing the possibility for ions or atoms of metal like Ni to enter the channel region. In this way, it is ensured that the connection between the source/drain regions of the transistor and the metal contact hole in the BEOL process has a low resistance. Besides, the current leakage due to the ions or atoms of metal like Ni entrance to the channel region can be reduced.

BRIEF DESCRIPTION OF THE DRAWINGS

The above and other features of the present invention will be more apparent from the embodiments shown in the accompanying drawings, in which.

DETAILED DESCRIPTION OF EMBODIMENTS

Figure 1:
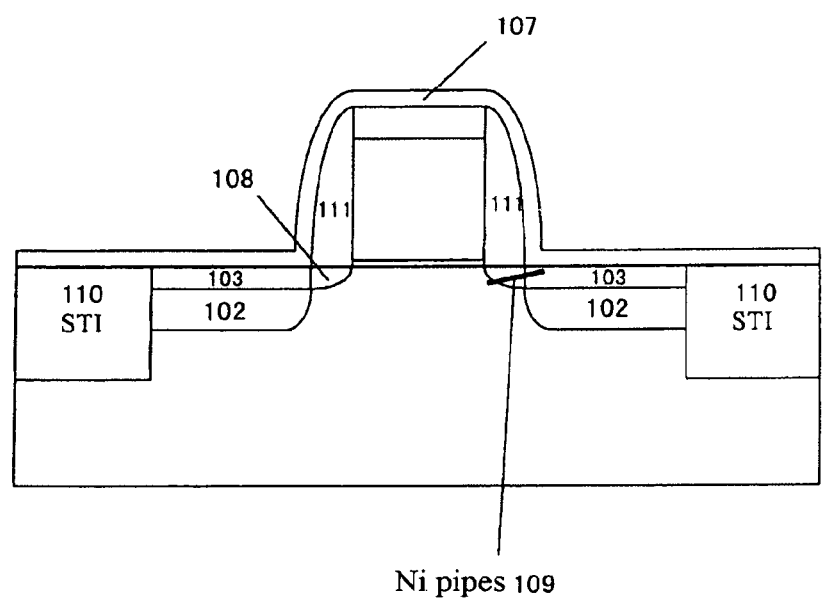
FIG. 1 schematically shows a structural sectional view of a transistor manufactured according to the prior art.

Firstly, it is noted that terms regarding position, orientation and shape in the present invention, such as "above", "below", "left" and "right", etc, refer to the direction as viewed from the front of the paper in which the drawings are located. Therefore, the terms "above", "below", "left" and "right", etc regarding position, orientation and shape in the present invention only indicate the relative positional, orientational and shaped relationship in the case as shown in the drawings. They are presented only for purpose of illustration, but not intend to restrict the scope of the present invention.

Hereinafter, the implementations provided by the present invention will be described in details with reference to the accompanying drawings. FIGS. 3-14 are shown by taking Si substrate as an example, but the present invention is not limited to the case of Si substrate as shown herein. The substrate may comprise any suitable semiconductor substrate material, which may be but not limited to Si, Ge, SiGe, SOI (silicon on insulator), SiC, GaAs or any III-V compound semiconductor, etc. According to the design requirements well known in the prior art, (e.g. p- or n-type substrate), the substrate may comprise various doping profiles. Furthermore, the substrate may optionally comprise an epilayer, and may be modified in stress to enhance performance.

Figure 2:
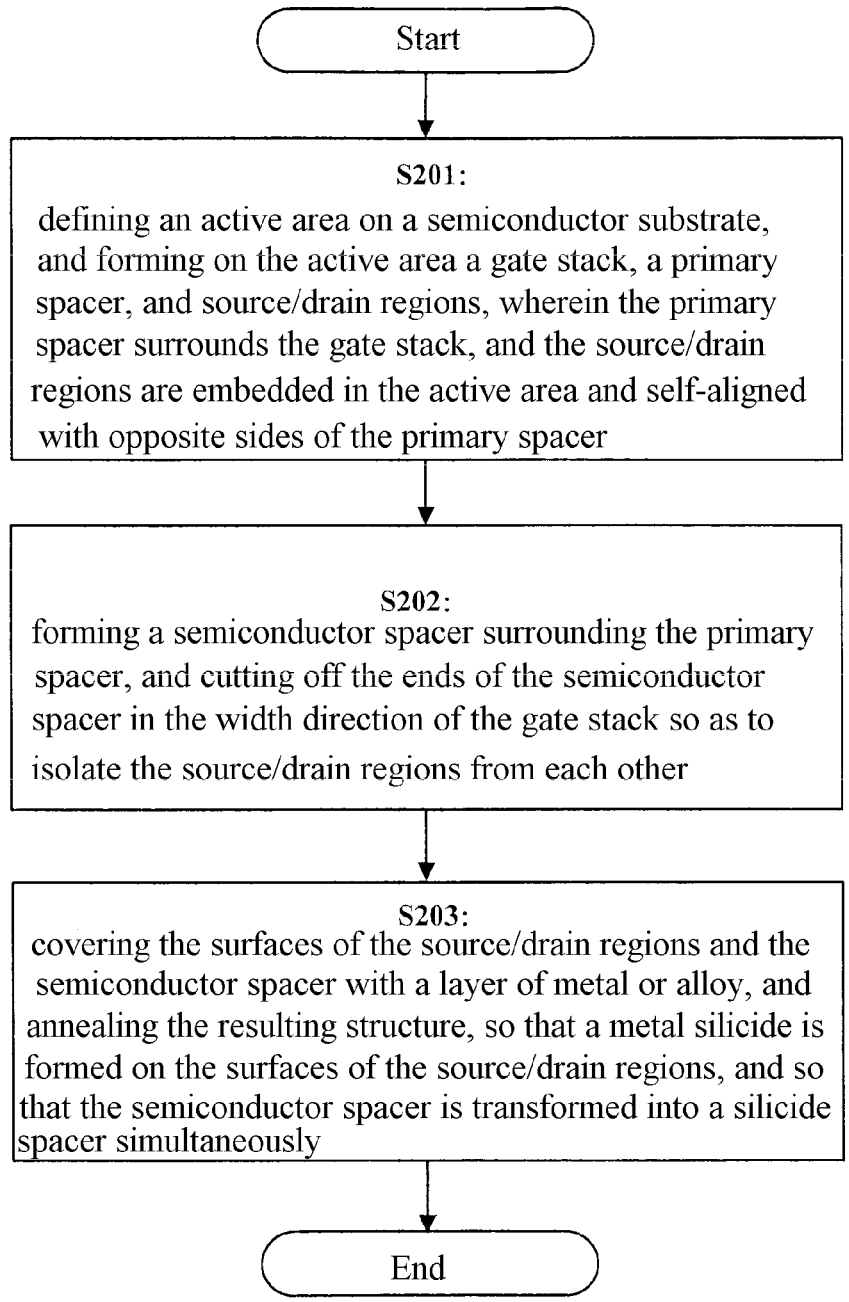
FIG. 2 schematically shows a flow chart of a method for manufacturing transistor according to an embodiment of the present invention.
Figure 3:
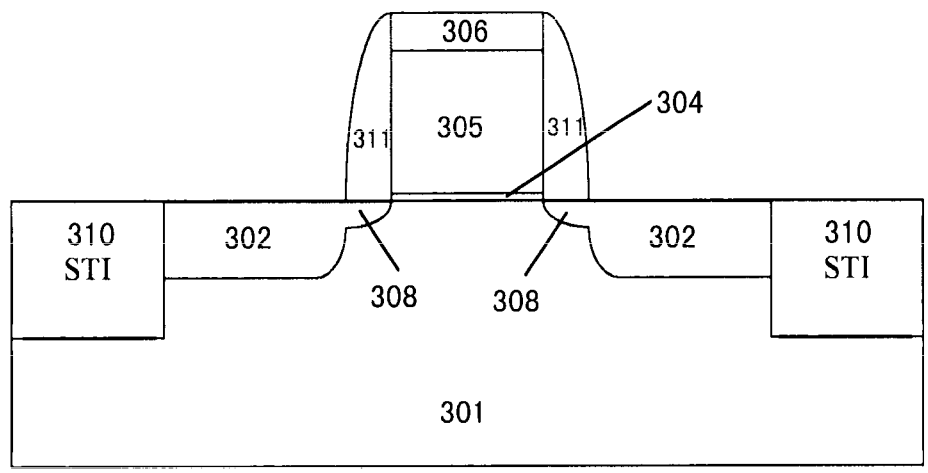
FIGS. 3-14 schematically show structural sectional views of immediate structures during manufacturing a transistor according to an embodiment of the present invention.

As shown in FIGS. 2-3, firstly a step S201 is performed. Namely, on a semiconductor substrate 301 an active area is defined, and on the active area a gate stack, primary spacer 311 and source/drain regions 302 are formed. The primary spacer 311 surround the gate stack, and the source/drain regions 302 is embedded in the active area and self-aligned with opposite sides of the primary spacer. Preferably, the active area may be isolated by an isolation structure. In the present invention, the isolation structure preferably uses a STI (Shallow Trench Isolation) 310. In generally, in a direction parallel with the width of the gate stack, both ends of each gate stack lies on STI 310. In views shown in FIGS. 3-6, and FIGS. 8-14, the length direction of the gate stack refers to the direction from left to right (or vice versa) which is parallel with the paper (the direction between the source region and the drain region), and the width direction of the gate stack refers to a direction perpendicular to the paper. It is not shown in FIG. 3 that both ends of the gate stack lie on STI 310. In an embodiment of the present invention, it is also possible to form source/drain extension regions 308 after forming the gate stack and before forming the primary spacer 311. The source/drain extension regions 308 are embedded in the active area and self-aligned with opposite sides of the gate stack. In various embodiments of the present invention, the gate stack may comprise a gate dielectric layer 304, a gate conductor layer 305 and a cap 306. In the transistor of the present invention, the gate dielectric layer 304 may be formed by a common dielectric material (e.g. $SiO_2$) or a high k material. The high k material for example may comprise one of $HfO_2$, HfSiO, HfSiON, HfTaO, HfSiO, HfZrO, $Al_2O_3$, $La_2O_3$, $ZrO_2$, LaAlO, or the combination thereof. The material used in the gate conductor layer 305 may comprise doped or un-doped polycrystalline silicon, doped or un-doped polycrystalline SiGe, amorphous Si, and/or metal (e.g. one of Ti, Co, Ni, Al, W, or the combination thereof), etc. If the high k material is used in the gate dielectric layer 304, the gate conductor layer 305 may use a metal material. The cap 306 covering the gate conductor layer 305 may be formed by an insulating material like silicon nitride. Considering the process for etching and depositing for example Ni or Ni alloy in the subsequent manufacturing process, the cap 306 is preferably formed on the gate conductor layer 305 by silicon nitride material. The reason lies in that silicon nitride does not react with any inorganic acid except hydrofluoric acid, exhibits high etching resistance, and will not wetted or etched by molten metals or alloys like Al, Pb, Sn, Ag, brass, Ni, etc. Based on the same reason, preferably, the primary spacer 311 surrounding the gate stack may be formed by silicon oxide, silicon nitride, SiON, SiC, SiOC or the like.

As is known to the skilled person in the art, the active area in the transistor of the present invention may comprise source/drain regions 302 and source/drain extension regions 308. As is known to the skilled person in the art, during operation of the transistor, between the source/drain extension regions 308 and even between the source/drain regions 302, a channel region adjacent to the bottom of the gate dielectric layer 304 and located within the active area may be formed.

Next, with reference to FIGS. 4-10, step S202 and step S203 are described. Namely, semiconductor spacers are formed to surround the primary spacer 311, and the ends of the semiconductor spacer are disconnected in the width direction of the gate stack so as to isolate the source/drain regions 302 from each other. A layer of metal or alloy is formed to cover the surface of the source/drain regions 302 and the semiconductor spacer, and the resulting structure is annealed, so that a metal silicide is formed on the surfaces of the source/drain regions 302 and the semiconductor spacer is transformed into a silicide spacer simultaneously.

In an embodiment of manufacturing a transistor according to the present invention, step S202 may comprise the following steps.

Figure 4:
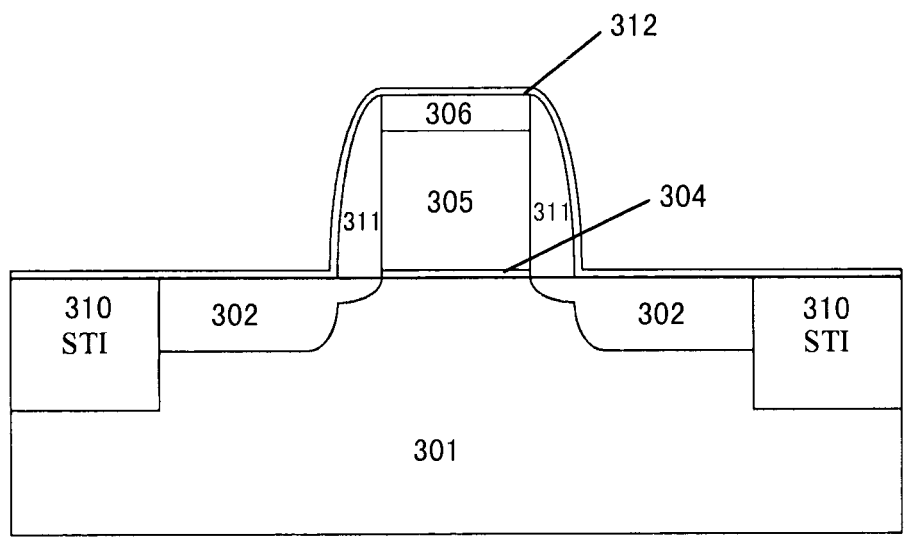

As shown in FIG. 4, a etch-stop layer 312 may be formed on the surfaces of the source/drain regions 302 and the primary spacer 311. During forming the etch-stop layer 312, to enable convenient manufacturing, an etch-stop layer may preferably be deposited evenly on the surfaces of the whole semiconductor structure (including the STI 310, source/drain regions 302, primary spacer 311, and the cap 306 in the gate stack) simultaneously. The case in which the etch-stop layer 312 is deposited evenly on the whole surface simultaneously is shown in FIG. 4. Of course, in another embodiment, it is also possible to form the etch-stop layer 312 only on the surfaces of the source/drain regions 302 and the primary spacer 311. The etch-stop layer may comprise amorphous Si, SiGe, or other conductive materials. In this process stage, the deposition may be performed by physical vapor deposition, chemical vapor deposition, atomic layer deposition, magnetron sputtering, ultra-high vacuum evaporation, or the like. It is apparent for the skilled person in the art to select a suitable depositing process according to the material to be used. The skilled person in the art should appreciate that STI 310 is not necessary for carrying out the present invention, and a transistor can also be manufactured in the present invention without STI 310.

Figure 5:
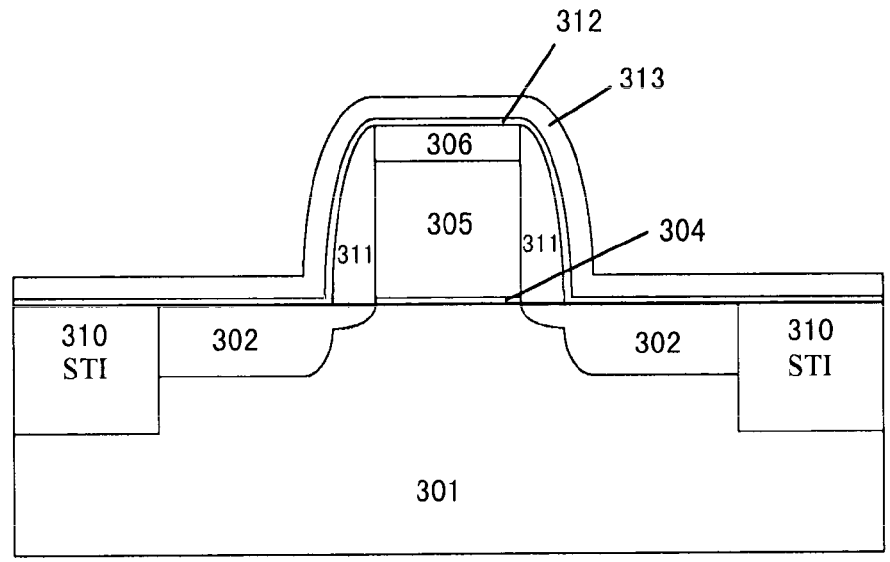

Then, with reference to FIG. 5, a semiconductor layer 313 is formed on the surfaces of the etch-stop layer 312. Since as shown in FIG. 4 the etch-stop layer 312 completely covers the whole surface of the STI 310, source/drain regions 302, primary spacer 311 and cap 306, the semiconductor layer 313 deposited on the surfaces of the etch-stop layer 312 as shown in FIG. 5 also completely covers the whole surface as described above. As mentioned above, completely covering the whole surface only serves to enable convenient manufacturing, but does not imply that the semiconductor layer 313 formed in the present invention should completely cover all of the surfaces mentioned above. Alternatively, it is only required the semiconductor layer 313 formed the present invention should cover the etch-stop layer 312 formed on the source/drain regions 302 and the primary spacer 311. The semiconductor layer 313 may be formed by SiGe or amorphous Si material. In this process stage, the deposition may be performed by physical vapor deposition, magnetron sputtering, ultra-high vacuum evaporation or the like. It is apparent for the skilled person in the art to select a suitable depositing process according to the material to be used. It is noted that, in order to achieve different selectivity ratios of the semiconductor layer with respect to the etch-stop layer during subsequent etching, different materials are used for the semiconductor layer 313 and the etch-stop layer 312. Namely, if the etch-stop layer 312 comprises amorphous Si, the semiconductor layer 313 preferably comprises SiGe.

Figure 6:
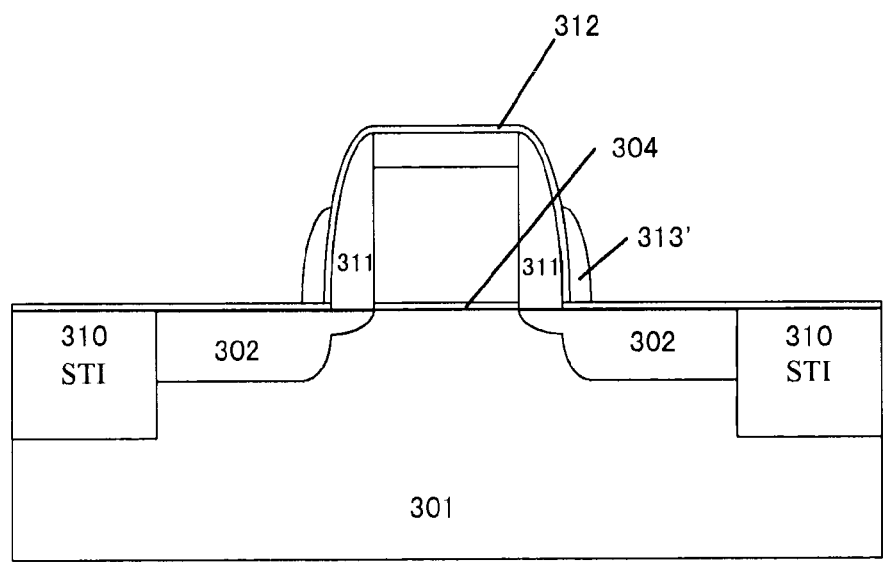
Figure 7:
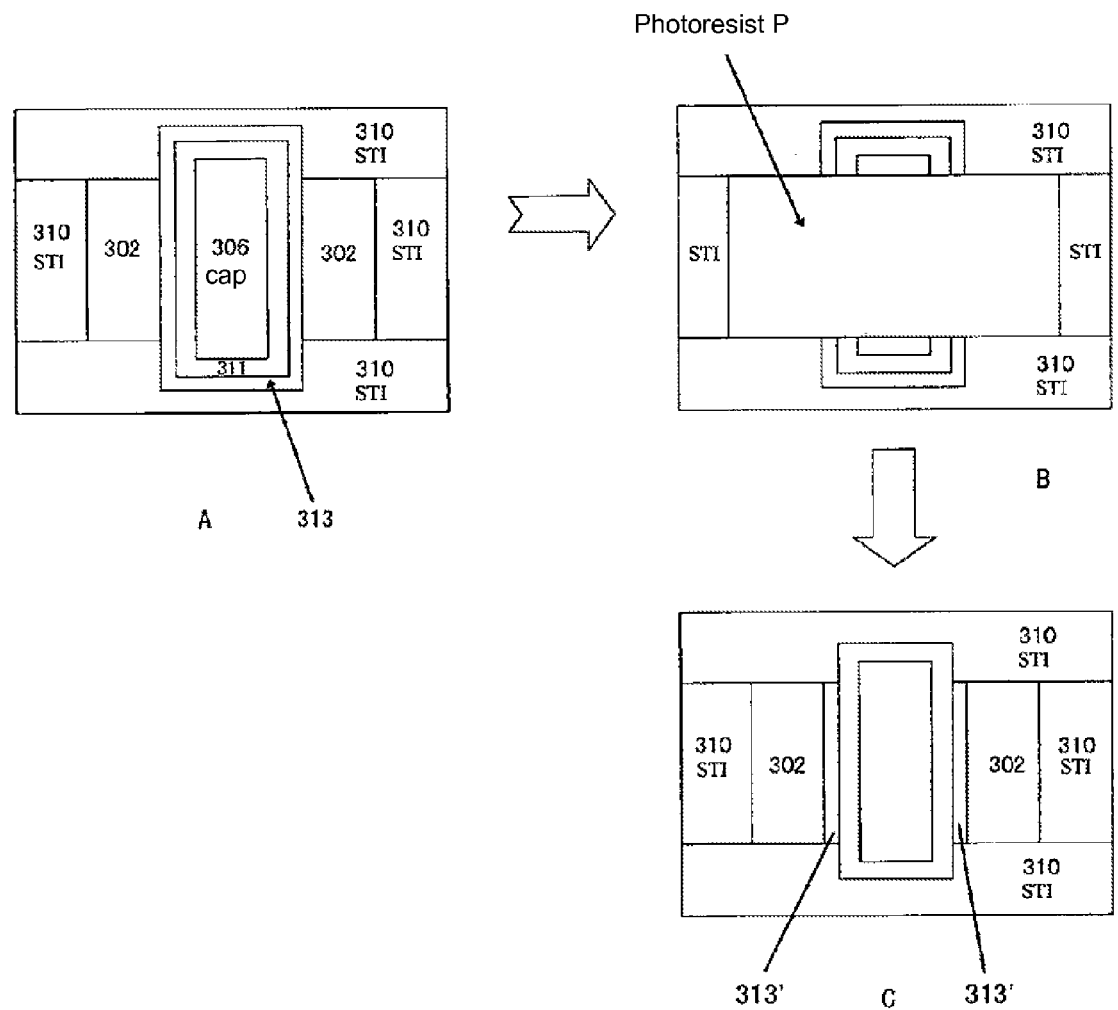

Then, with reference to FIG. 6, the semiconductor layer 313 is etched to form semiconductor spacer 313' surrounding the primary spacer 311. Preferably, the height of the semiconductor spacer 313' is lower than that of the primary spacer 311, so as to avoid connection and electrical conduction between the semiconductor spacer 313' at both sides over the source/drain regions 302, if the height of the semiconductor spacer 313' is larger than that of the primary spacer 311. FIG. 7A shows a top view of the STI 310 surrounding the manufactured transistor, the source/drain regions 302, the cap 306 in the gate stack, the primary spacer 311 surrounding the cap 306, and the semiconductor layer 313 surrounding the primary spacer 311. However, at this time, the semiconductor spacers enable the electrical conduction between the source/drain regions 302. In order to solve this problem, it is required to remove the ends of the semiconductor spacer in the gate width direction by etching so as to avoid electrical conduction between the source/drain regions 302. Alternatively, as shown in FIG. 7A, the semiconductor spacer on the upper and lower sides of the STI 310 are removed by etching to disconnect the source/drain regions, so as to form on the source/drain regions 302 the semiconductor spacer 313' which are separated but adjacent to the primary spacer 311. Then the photoresist pattern shown in FIG. 7B is formed. The specific method may comprise spinning a photoresist on the whole semiconductor structure, and then exposing and developing, so that the photoresist P only remains at the position shown in FIG. 7B. In FIG. 7B, the resulting photoresist pattern covers all the way from the source region to the drain region, and extends appropriately over the STI 310 in the length direction of the gate to provide a better protection for the semiconductor spacer on the source/drain regions. The STI 310 in the width direction of the gate is exposed. In FIG. 7C, the exposed semiconductor layer 313 is removed by etching to form the semiconductor spacer 313' of desired shape. FIG. 7C shows in a top view a structure in which the semiconductor spacer 313' are formed at opposite sides of the primary spacer 311 over the source/drain regions 302, while the semiconductor spacer on the other portion (mainly STI 310) are removed. The semiconductor spacer 313' formed as mentioned above is only an example. The semiconductor spacer 313' in FIG. 7C may also partially cover the STI structure in the gate width direction. The skilled person in the art should appreciate that the semiconductor spacer 313' may be designed to have different shapes and sizes as needed. It is noted that the two semiconductor spacer 313' formed at opposite sides of the primary spacer 311 and on the source/drain regions 302 should be separated from each other to avoid electrical conduction between the source/drain regions 302 which may induce current leakage. As shown in FIGS. 7A-7C, the active area is isolated by an isolation structure like STI 310, and in the width direction of the gate stack, the ends of the gate stack lie above the isolation structure like STI 310. In this case, the step of removing the ends of the semiconductor spacer 313' in the width direction of the gate by etching comprises: removing a portion of the semiconductor spacer over the isolation structure like STI 310 by etching.

Figure 8:
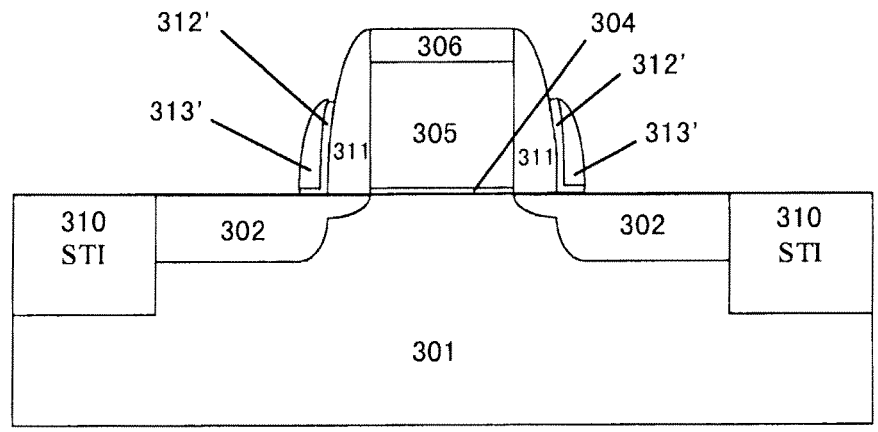

Hereinafter, with reference to FIG. 8, the exposed etch-stop layer 312 is removed to form the etch-stop layer spacer 312'. As is known to the skilled person in the art, with respect to different material of the etch-stop layer 312, suitable etchants may be selected to etch the etch-stop layer which is not covered by the semiconductor spacer 313' to form the etch-stop layer spacer 312'. For example, selective dry etching may be used to remove the exposed etch-stop layer. This is not described herein for simplicity.

Figure 9:
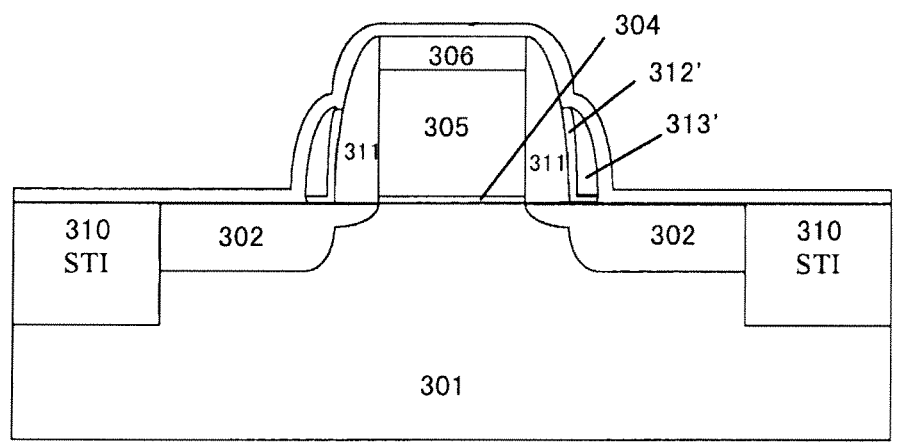

With reference to FIG. 9, a layer of metal or alloy is formed to cover surface of the source/drain regions 302 and the semiconductor spacer 313', and the resulting structure is annealed so that the metal or alloy react with the semiconductor spacer 313' and the source/drain regions 302. Preferably, the step of a layer of metal or alloy being formed to cover the surface of the source/drain regions 302 and the semiconductor spacer 313', and annealing the resulting structure may comprise: depositing a layer of metal or alloy on surfaces of all of the semiconductor substrate 301, the source/drain regions 302, the primary spacer 311 and the semiconductor spacer 313', and annealing the resulting structure. To enable convenient manufacturing, more preferably, a metal or alloy, like Ni, Co, Ti or NiPt may be deposited on the whole surface of the STI 310, the source/drain regions 302, the semiconductor spacer 313', the primary spacer 311 and the cap 306 in the gate stack simultaneously, and the resulting structure is annealed at 800-1100° C., so that the source/drain regions 302 and the semiconductor spacer 313' react with the metal or alloy. For example, if Ni or NiPt is deposited, the semiconductor spacer 313' and the source/drain regions 302 embedded in the semiconductor substrate 301 (e.g. Si substrate) will react with Ni to form silicides of Ni, for example NiSi, $Ni_2Si$, $Ni_3Si$ or the like. A metal silicide contact is formed in the surface of the source/drain regions, and the semiconductor spacer 313' form silicide spacer. Different metal silicides will be formed, when different metals and alloys are deposited. The purpose of forming respective metal silicides is to provide a low resistance connection between the contact hole which will be formed subsequently and the source/drain regions 302. The skilled person in the art, based on the knowledge they have, will have no difficulty in determining the deposition method and corresponding parameters, the temperature, time, and atmosphere for annealing in the above procedure.

Preferably, the material of the etch-stop layer spacer 312' differs from that of the semiconductor spacer 313'. For example, if the semiconductor spacers 313' are formed by amorphous Si, for example, Ni will diffuse into and react with amorphous Si during annealing, thus forming silicides of Ni, e.g. NiSi, $Ni_2Si$, $Ni_3Si$ or the like. At this time, the etch-stop layer spacer 312' are preferably formed by SiGe, because SiGe and amorphous Si belong to two kinds of materials with different lattice structure, so that Ni will diffuse in these materials at different speeds. The semiconductor spacer 313' covering the outside of etch-stop layer spacer 312' will certainly reduce the possibility for Ni to diffuse into the etch-stop layer spacer 312'. Furthermore, it is noted that by means of the two-layer arrangement comprising the etch-stop layer spacer 312' and the semiconductor spacer 313', the physical distance between Ni diffusing into the semiconductor spacer 313' and the source/drain extension regions is increased, which will be discussed in the following.

Figure 10:
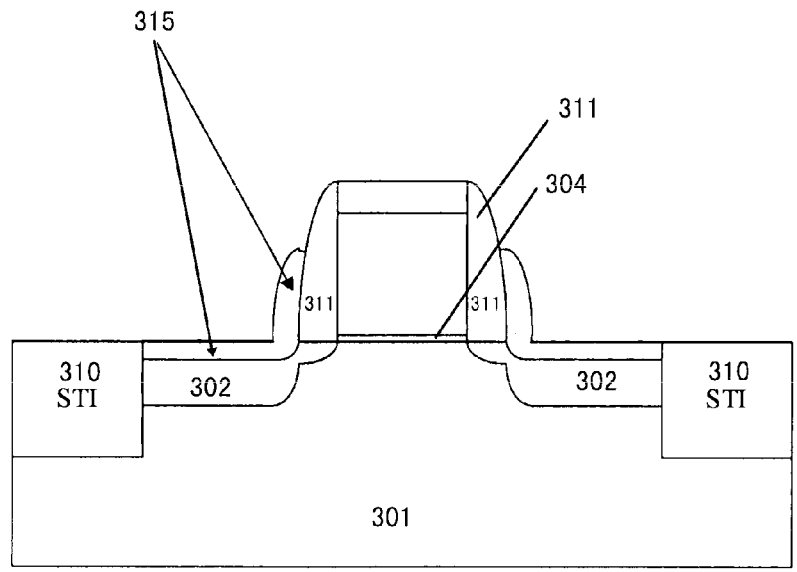
Figure 11:
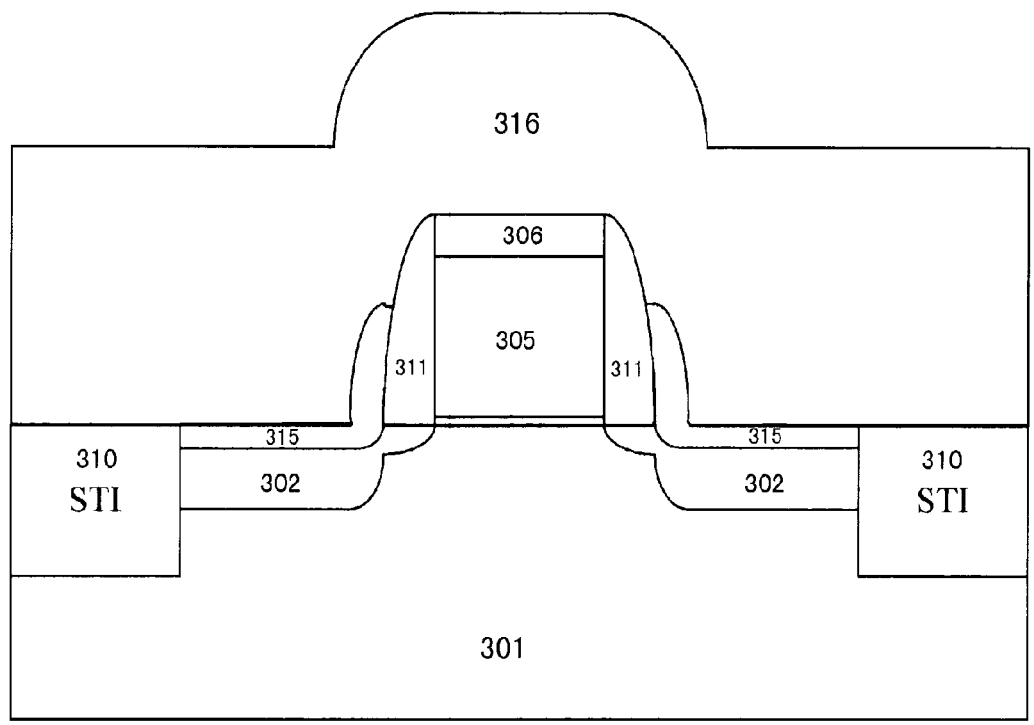

Then, with reference to FIG. 10, unreached metal or alloy is removed. In FIG. 10, after the unreached metal or alloy (e.g. Ni) is removed, the resulting metal silicide layer 315 is exposed. The metal silicide layer 315 comprises the following two parts: i.e., a metal silicide contact part formed in the source/drain regions 302, and a silicide spacer part covering the side face of the primary spacer 311. The metal silicide contact part and the silicide spacer part are formed simultaneously in the above annealing process.

It is easy for the skilled person in the art, based on the knowledge they have, to select a suitable etchant(s) according to the different metal or alloy to remove the unreached metal or alloy. This is not described herein for simplicity.

By comparing FIG. 10 showing a transistor manufactured according to the present invention and FIG. 1 representing the prior art transistor, it can be found that, on one hand, the semiconductor spacer manufactured according to an embodiment of the present invention react with the metal in the contact (e.g. Ni or Ni-based compounds) to form silicide spacer, thus significantly preventing the metal from entering the channel region; and on the other hand, the semiconductor spacer also increase the distance between the metal and the channel region. However, in the prior art FIG. 1, the layer of silicide of Ni 103 is closer to the channel region between the source/drain regions 102. In the embodiments of the present invention, the method of forming the metal silicide contact and the silicide spacer simultaneously not only ensures that the connection between the transistor source/drain regions and the metal contact hole in the BEOL process has a low resistance, but can also reduce the current leakage between the source/drain regions due to the ions or atoms of Ni entrance to the channel region.

In the above description, reference is made by taking Ni as an example. It is apparent for the skilled person in the art that different compounds will be formed, if different metals or alloys, different materials for the semiconductor spacer 313 and the etch-stop layer spacer 312', and different materials for the source/drain regions 302 are used.

Figure 12:
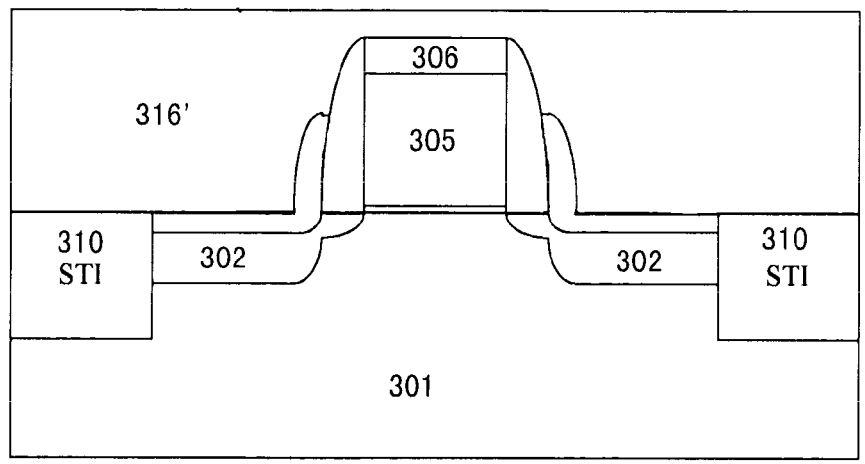

To fabricate a complete transistor, the following steps may further be comprised. Namely, with reference to FIG. 11, an interlayer dielectric layer 316 is formed on the whole semiconductor structure. Then, for example, by means of CMP or the like, the interlayer dielectric layer 316 is planarized, so that the interlayer dielectric layer 316 is planarized into a relatively thin interlayer dielectric layer 316, as shown in FIG. 12.

Figure 13:
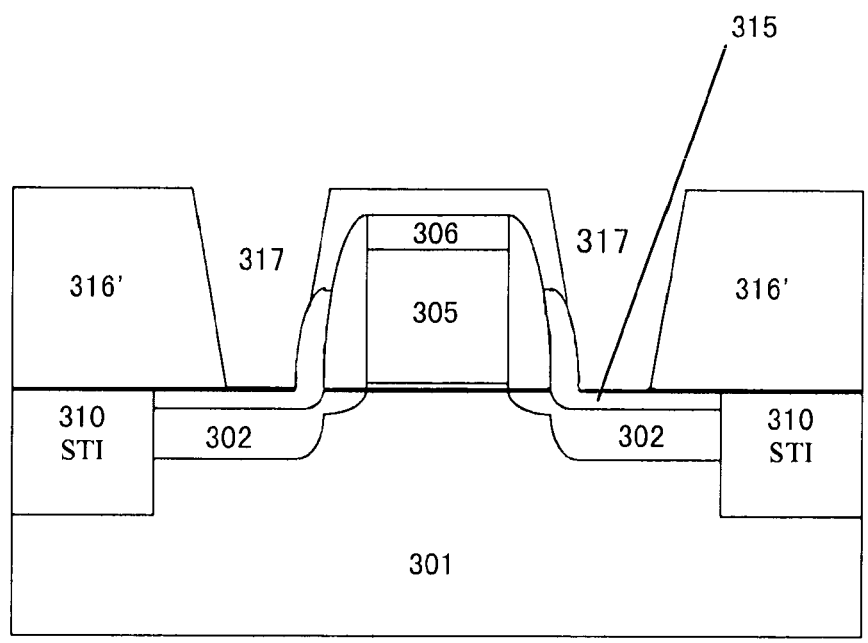

Then, with reference to FIG. 13, contact trenchs 317 are formed in regions of the interlayer dielectric layer 316' corresponding with the source/drain regions 302. As is known to the skilled person in the art, different etchants may be used to etch different interlayer dielectric layers 316'. Due to the presence of the silicide spacer formed previously in the present invention, erosion of the primary spacer 311 by the etchant can be efficiently prevented when the interlayer dielectric layer 316' is etched to form the contact trench 317, thus reducing risk of short circuit between the gate in the gate stack and the metal formed subsequently for filling the contact trench. After forming the contact trench 317, the metal silicide contact (i.e. Ni silicide) formed in the source/drain regions 302 is exposed. For example, in FIG. 13, the exposed surface of the silicide Ni is the lower surface of the contact trench 317.

In the step of forming the contact trench 317 in the region of the interlayer dielectric layer 316', the contact trench 317 may be formed in the region of the interlayer dielectric layer 316' adjacent to the silicide spacer 315 (as is the case shown in FIG. 13), if the transistor further scales down. Since Ni silicide is formed on the surface silicide spacer, the contact area between the Ni silicide and the metal filled subsequently in the contact trench 317 will be increased, which further reduces the contact resistance.

Figure 14:
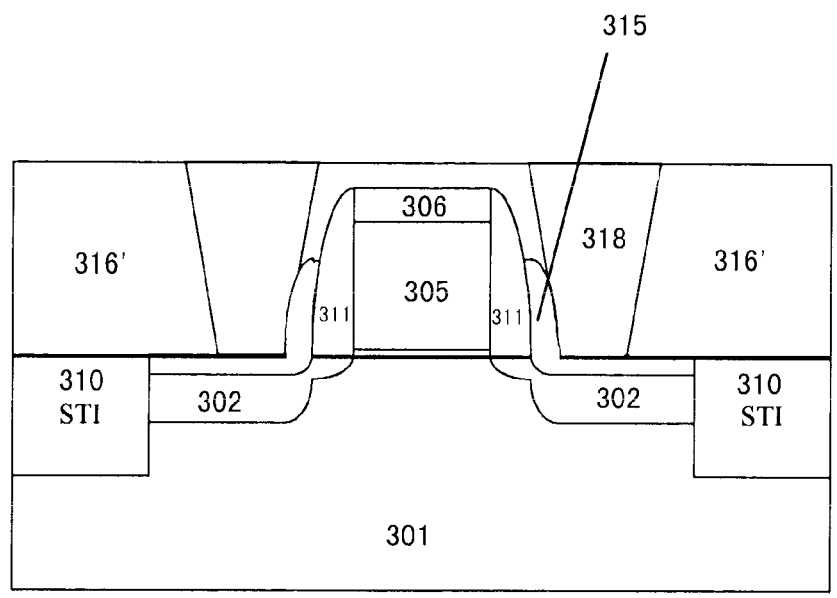

According to an embodiment of the present invention, the method for manufacturing a transistor may further comprise: filling the contact trench with a metal, and planarizing the filled metal to form a contact plug. The planarized contact plug 318 is shown in FIG. 14. Filling the contact trench 317 with a metal may comprise: forming a liner like Ti/TiN or Ta/TaN to cover the side wall and bottom wall of the contact trench 317; filling a metal material on the liner, the filled metal material may comprise one of Al, W, TiAl and Cu or the combination thereof.

Then, the subsequent processes for manufacturing the transistor may be performed on the present invention. These subsequent processes are well known for the skilled person in the art, and are not described herein for simplicity.

It is another object of the present invention to provide a novel transistor.

As shown in FIG. 14, in an embodiment of the present invention, the transistor of the present invention comprises: the active area on the semiconductor substrate 301, and the gate stack, the primary spacer 311 and the source/drain regions 302 on the active area, wherein the primary spacer 311 surround the gate stack, the source/drain regions 302 are embedded in the active area and self-aligned with opposite sides of the primary spacer 311. Furthermore, the transistor of the present invention may further comprise: silicide spacer, wherein the silicide spacer are located on opposite sides of the primary spacer 311, and dielectric material is filled between the ends of the silicide spacer in the width direction of the gate stack, so as to isolate the source/drain regions from each other. The silicide spacer at opposite sides of the primary spacer 311 significantly prevent metal from entering the channel region, because the metal or alloy like Ni is formed as a portion of the silicide spacer, thus reducing the probability for the free Ni atoms or ions to enter the channel region through the source/drain extension regions. As compared with for example the transistor in the prior art shown in FIG. 1, the metal Ni is not formed into a silicide like NiSi, and the free Ni atoms or ions adhere to opposite sides of the spacer 111. As mentioned above, the free Ni atoms or ions have a large probability to enter the channel region through the source/drain extension regions.

Preferably, an insulating dielectric material is filled between the ends of the silicide spacer in the width direction of the gate stack, so as to isolate the source/drain regions from each other.

Preferably, in the transistor according to another embodiment of the present invention, a metal silicide layer is further provides on the surfaces of the source/drain regions 302. Preferably, the metal silicide layer is a metal silicide contact embedded in the source/drain regions 302.

Preferably, a etch-stop layer is sandwiched between the silicide spacer and the primary spacer 311, and the etch-stop layer comprises SiGe or amorphous Si. By arranging a etch-stop layer between the silicide spacer and the primary spacer 311, it is possible to further prevent the atoms or ions, e.g. Ni, in the silicide spacer from entering the primary spacer.

Preferably, the silicide spacer are formed by the reaction between the amorphous Si or SiGe and the metal or alloy during annealing.

Preferably, the height of the silicide spacer is lower than that of the primary spacer.

Preferably, the silicide spacer comprise Ni element. Optionally, in the embodiments of the present invention, the silicide spacer may further comprise the element like Co, Ti or Pt, etc.

Preferably, if the active area is isolated by an isolation structure like STI 310, and the ends of the gate stack lie above the isolation structure, a dielectric material is provided on the isolation structure (e.g., STI 310) between the ends of the silicide spacer. Preferably, the dielectric material is an insulating dielectric material.

It is a further object of the present invention to provide a novel semiconductor chip, which comprises the transistor as shown in FIG. 14.

It is noted that, the manufacturing of a transistor like MOSFET is described as an example in the above description of the present invention. As is known to the skilled person in the art, in accordance with the spirit and principle of the present invention, the manufacturing method of the present invention is not limited to MOSFET, but also applicable to the bipolar transistor, the junction field-effect transistor, or other types of transistor and other semiconductor devices. Therefore, the method for manufacturing a semiconductor device which comprises the steps of the method for manufacturing a transistor as described above also falls within the scope of the present invention.

Although the present invention has been described with reference to the embodiments which have been contemplated currently, it should be appreciated that the present invention is not limited to the disclosed embodiments. On the contrary, the present invention intends to cover all modifications and equivalents which fall within the spirit and scope of the appended claims. The scope of the appended claims should be interpreted to the broadest extent to cover all these modifications and equivalents.

What is claimed is:

1. A method for manufacturing a transistor, comprising:
defining an active area on a semiconductor substrate, and forming on the active area a gate stack, a primary spacer, and source/drain regions, wherein the primary spacer surrounds the gate stack, and the source/drain regions are embedded in the active area and self-aligned with opposite sides of the primary spacer;
forming a semiconductor spacer surrounding the primary spacer, and cutting off the ends of the semiconductor spacer in the width direction of the gate stack so as to isolate the source/drain regions from each other; and
covering the surfaces of the source/drain regions and the semiconductor spacer with a layer of metal or alloy, and annealing the resulting structure, so that a metal silicide is formed on the surfaces of the source/drain regions, and so that the semiconductor spacer is transformed into a silicide spacer simultaneously;
wherein the step of forming the semiconductor spacer surrounding the primary spacer and cutting off the ends of the semiconductor spacer in the width direction of the gate stack so as to isolate the source/drain regions from each other further comprises:
forming an etch-stop layer on the surfaces of the source/drain regions and the primary spacer;
forming a semiconductor layer on a surface of the etch-stop layer;

etching the semiconductor layer to form the semiconductor spacer surrounding the primary spacer;

removing the ends of the semiconductor spacer in the width direction of the gate by etching to avoid electrical conduction between the source/drain regions; and removing an exposed portion of the etch-stop layer.

2. The method according to claim 1, wherein, in the step of etching the semiconductor layer to form the semiconductor spacer surrounding the primary spacer, the height of the semiconductor spacer are lower than that of the primary spacer.

3. The method according to claim 1, wherein, if the active area is isolated by an isolation structure, and if in the width direction of the gate stack, the ends of the gate stack lie above the isolation structure, the step of removing the ends of the semiconductor spacer in the width direction of the gate by etching further comprises:

removing a portion of the semiconductor spacer on the isolation structure by etching.

4. The method according to claim 1, wherein, after the step of covering the surfaces of the source/drain regions and the semiconductor spacer with the layer of metal or alloy and annealing the resulting structure, the method further comprises:

removing unreacted metal or alloy.

5. The method according to claim 1, wherein, the step of covering the surfaces of the source/drain regions and the semiconductor spacer with the layer of metal or alloy and annealing the resulting structure comprises:

depositing the layer of metal or alloy on surfaces of all of the semiconductor substrate, the source/drain regions, the primary spacer, and the semiconductor spacer, and annealing the resulting structure.

6. The method according to claim 1, wherein the layer of metal or alloy comprises Ni, Co, Ti, or NiPt.

7. The method according to claim 1, wherein the etch-stop layer comprises SiGe or amorphous Si.

8. The method according to claim 1, wherein the semiconductor spacer comprises amorphous Si or SiGe.

9. The method according to claim 1, wherein the material of the etch-stop layer differs from that of the semiconductor spacer.

* * * * *